United States Patent [19]

Einthoven et al.

[11] Patent Number: 4,891,685
[45] Date of Patent: Jan. 2, 1990

[54] RECTIFYING P-N JUNCTION HAVING IMPROVED BREAKDOWN VOLTAGE CHARACTERISTICS AND METHOD FOR FABRICATING SAME

[75] Inventors: Willem G. Einthoven, Belle Mead, N.J.; Muni M. Mitchell, Huntington, N.Y.

[73] Assignee: General Instrument Corporation, New York, N.Y.

[21] Appl. No.: 142,737

[22] Filed: Jan. 11, 1988

Related U.S. Application Data

[62] Division of Ser. No. 784,451, Oct. 4, 1985, Pat. No. 4,740,477.

[51] Int. Cl.⁴ ............................................. H01L 29/12
[52] U.S. Cl. ........................................ 357/56; 357/55; 357/13; 357/53
[58] Field of Search ..................... 357/56, 55, 13, 53

[56] References Cited

U.S. PATENT DOCUMENTS

| | | | |
|---|---|---|---|
| 2,975,080 | 3/1961 | Armstrong | 356/56 |
| 3,413,527 | 11/1968 | Davies | 357/56 |
| 3,617,821 | 11/1971 | Einthoven | 357/81 |
| 3,669,773 | 6/1972 | Levi | 29/578 |
| 3,674,995 | 7/1972 | Kendall | 148/DIG. 162 |
| 3,832,246 | 8/1974 | Lynch | 29/580 |
| 4,047,196 | 9/1977 | White | 357/56 |
| 4,255,757 | 3/1981 | Hikin | 357/58 |

FOREIGN PATENT DOCUMENTS 1489937 4/1969 Fed. Rep. of Germany .
2113907 8/1983 United Kingdom .

OTHER PUBLICATIONS

Ghandhi, S. K. "VLSI Fabrication Principles", John Wiley & Sons, New York, 1983, pp. 372, 570-571.
R. L. Davies and F. E. Gentry, "Control of Electric Field at the Surface of P—N Junctions", IEEE Transactions on Electron Devices, Jul. 1964, pp. 313-323.
B. Streetman, "Solid State Electronic Devices", 1980, Prentice Hall, Englewood Cliffs, N.J., pp. 163-164.

Primary Examiner—William D. Larkins
Assistant Examiner—David Soltz
Attorney, Agent, or Firm—Barry R. Lipsitz

[57] ABSTRACT

A rectifier is fabricated from a P-N junction having a P-type semiconductor layer and an adjacent N-type semiconductor layer. A mesa structure is formed in at least one of said layers. Impurities are deposited at the top of the mesa to form a high concentration region in the surface thereof. The impurities are diffused from the top surface of the mesa toward the P-N junction, whereby the mesa geometry causes the diffusion to take on a generally concave shape as it penetrates into the mesa. The distance between the perimeter of the high concentration region and the wafer substrate is therefore greater than the distance between the central portion of said region and the wafer substrate, providing improved breakdown voltage characteristics and a lower surface field. Breakdown voltage can be measured during device fabrication and precisely controlled by additional diffusions to drive the high concentration region to the required depth.

10 Claims, 2 Drawing Sheets

RECTIFYING P-N JUNCTION HAVING IMPROVED BREAKDOWN VOLTAGE CHARACTERISTICS AND METHOD FOR FABRICATING SAME

This application is a division of application Ser. No. 784,451, filed Oct. 4, 1985, now U.S. Pat. No. 4,740,477.

BACKGROUND OF THE INVENTION

The present invention relates to rectifiers and more particularly, to a rectifier having a mesa structure and concave doping profile. The structure of the rectifier results in a reduction of the electric field on the surface thereof and a corresponding improvement in breakdown voltage characteristics.

Semiconductor rectifiers or "diodes" are used in virtually all electronic products to provide directional control of current flow in a circuit. Diodes are fabricated from a P-N junction which, fundamentally, is a structure containing a P-type semiconductor in contact with an N-type semiconductor. In such a device, current will easily flow in the direction from the P-type material to the N-type material. Current does not, however, flow easily in the opposite direction (i.e., from the N-type semiconductor to the P-type semiconductor).

Various methods have been devised to fabricate semiconductor diodes. For example, a P-type semiconductor material can be brought into intimate physical contact with a separate N-type semiconductor material. In practice, however, P-N junctions are usually fabricated by chemically modifying an otherwise uniform crystal to create an abrupt change of doping (i.e., impurity levels) between two portions of the crystal. A semiconductor material frequently used to produce rectifiers is silicon.

Silicon P-N junctions will normally break down at the surface of the device, and not in the bulk silicon as desired, unless special precautions well-known in the art are taken. With higher voltage breakdowns, more care has to be taken to prevent surface breakdown than with lower voltage breakdowns. If sufficient precautions are taken, avalanche or "zener" breakdown will occur in the direction opposite to normal current flow (the "reverse bias" direction), and even large electrical energy pulses in the reverse bias direction will not damage the diode. Silicon diodes operated in the zener breakdown mode are useful in maintaining constant voltages (e.g., power supply output voltages) from several volts to several hundred volts with power ratings up to 50 watts or more.

At high voltages, it is important for rectifiers to have a surface field strength (voltage per unit area) that is at least one-third to one-half the breakdown voltage of the device. It is known that with proper surface contouring, the peak surface field of P-N junctions can be reduced. See, for example, the article entitled "Control Of Electric Field At Surface Of P-N Junctions", R. L. Davies and F. E. Gentry, *IEEE Transactions On Electron Devices*, July, 1964, pp. 313–323. Practical problems have arisen, however, in producing such P-N junctions. In practice, diodes are typically manufactured using heavily doped P-type and N-type regions with a high ohmic region in between. The width of the high ohmic region is critical in defining the breakdown voltage of the device. However, in previously known structures, including the contoured structures proposed by Davies and Gentry, a tradeoff occurred because as the width of the high ohmic region was decreased, the breakdown voltage at the surface of the device also decreased to unacceptable levels.

It would be advantageous to provide a rectifier having improved voltage breakdown characteristics together with a method for manufacturing such rectifiers wherein precise control of the breakdown voltage is achieved. It would be further advantageous to provide such a rectifier having a surface field that is much lower than the electric field in the bulk semiconductor from which the device is fabricated. Such a rectifier should be easily mass produced and have exceptional high temperature reverse bias stability. It would be further advantageous to provide such a rectifier that is very highly passivated.

The present invention relates to such a rectifier and method for fabricating the same.

SUMMARY OF THE INVENTION

In accordance with the present invention, a method is provided for fabricating a rectifier. The method comprises the steps of providing a P-N junction in a $<100>$ crystalline structure having a layer of highly doped P-type semiconductor material (P+) and an adjacent layer of lightly doped N-type semiconductor material (N−). A mesa structure is formed in at least one of said layers, (e.g., the lightly doped N-layer). In a preferred embodiment, the mesa will have a frustum shape. Impurities are deposited at the top of the mesa to form a high concentration region in the surface thereof. The impurities are then diffused from the top surface deeper into the mesa toward the P-N junction, whereby the mesa geometry causes the diffusion to take on a generally concave shape as it penetrates into the mesa.

The method can comprise the further steps of measuring the breakdown voltage of the P-N junction after the diffusion step, and diffusing the impurities deeper into the mesa to achieve a lower breakdown voltage if the measured voltage is too high. The measuring and diffusing steps can be repeated until a desired breakdown voltage is achieved.

The P-N junction for the rectifier can be formed in an epitaxial wafer. Where the wafer has a $<100>$ crystal orientation, the mesa can be anisotropically etched therein. The shape of the resultant mesa is determined by the particular masking pattern used to define the etch.

The method of fabricating the rectifier can comprise the further step of applying a passivation layer to the side wall of the mesa.

A rectifier in accordance with the present invention comprises a P-N junction formed from a layer of P-type semiconductor material and an adjacent layer of N-type semiconductor material, at least one of the layers (e.g., the N-type layer) forming a mesa. A high concentration region extends from the top of the mesa toward the P-N junction, the high concentration region having a generally concave shape when viewed from the top of the mesa. The distance between the perimeter of the high concentration region and the P-N junction is greater than the distance between the central portion of said region and the P-N junction. The rectifier can further comprise a metal layer overlaying at least part of the mesa sidewall to provide a field shield. The depth of the high concentration region can be set to establish a desired breakdown voltage for the rectifier.

DETAILED DESCRIPTION OF THE INVENTION

The rectifier of the present invention utilizes a mesa structure to obtain improved breakdown voltage characteristics and particularly a higher breakdown voltage at the surface of the device. This result is accomplished by providing a high ohmic region in between heavily doped P-type and N-type regions wherein the width of the high ohmic region is greater at its edges than in the central portion thereof. Since the high ohmic portion is wider along the sloped side wall of the mesa than in the bulk semiconductor material, a high breakdown voltage can be achieved at the surface of the device.

Figure 1:
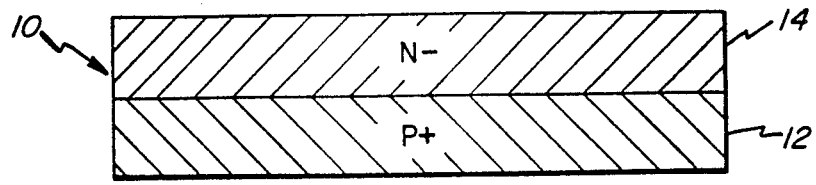
FIG. 1 is a cross-sectional view of a epitaxial wafer having an N− epitaxial layer on a P+ substrate.

The rectifier device is fabricated from a P-N junction 10 as shown in FIG. 1 having a layer of P-type semiconductor material 12 and an adjacent layer of N-type semiconductor material 14. P-N junction 10 can comprise an epitaxial silicon wafer having a <100> crystal orientation. The N− epitaxial layer 14 is grown on the P+ substrate 12.

Figure 2:
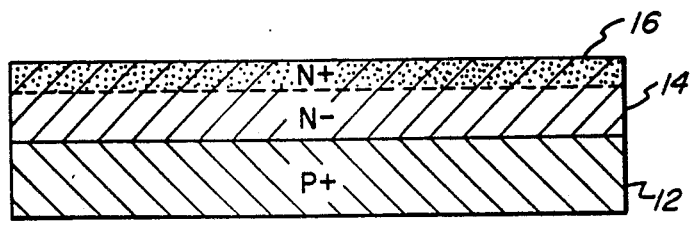
FIG. 2 is a cross-sectional view of the wafer of FIG. 1 on which impurities have been deposited to form an N+ high concentration region.
Figure 3:
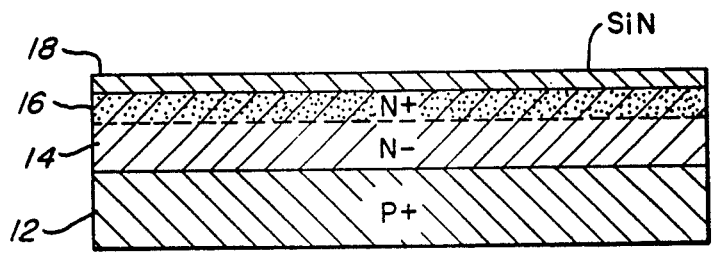
FIG. 3 is a cross-sectional view of the wafer of FIG. 2 on which a silion nitride layer has been deposited.
Figure 4:
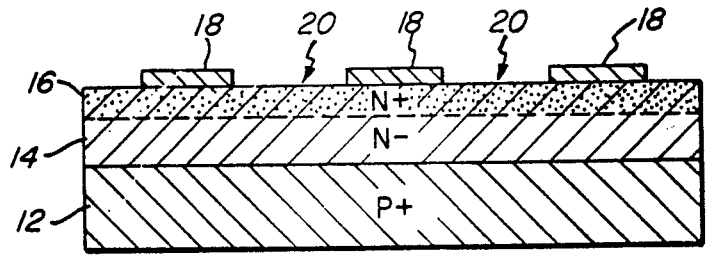
FIG. 4 is a cross-sectional view of the wafer of FIG. 3 after the silicon nitride layer has been selectively removed to define mesa locations.
Figure 5:
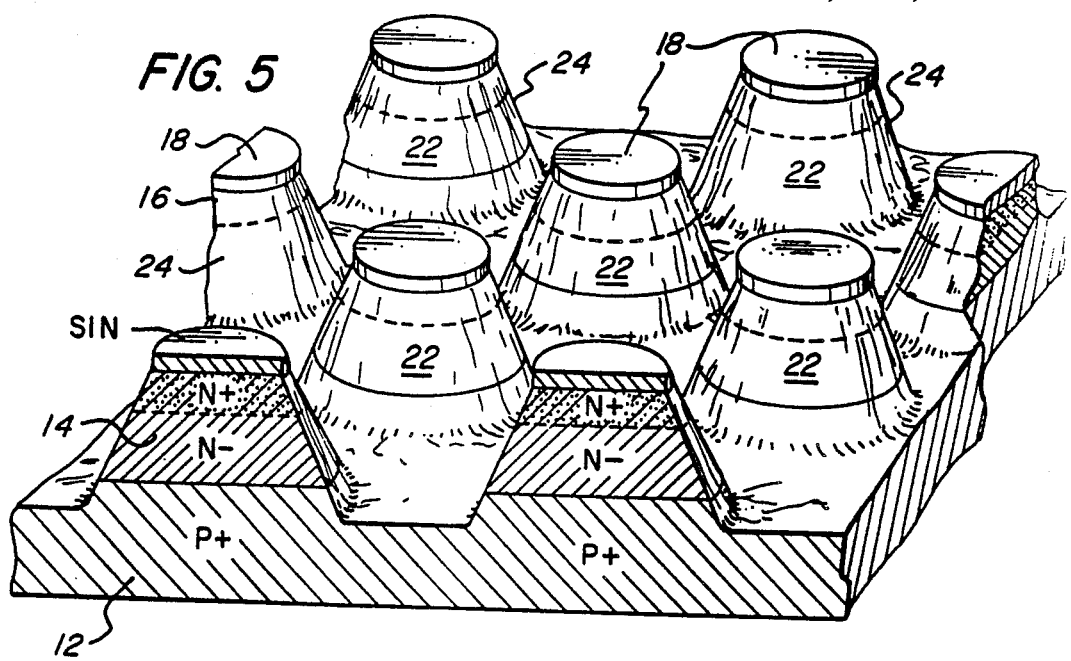
FIG. 5 is a perspective view of the wafer after mesas have been etched therein.
Figure 6:
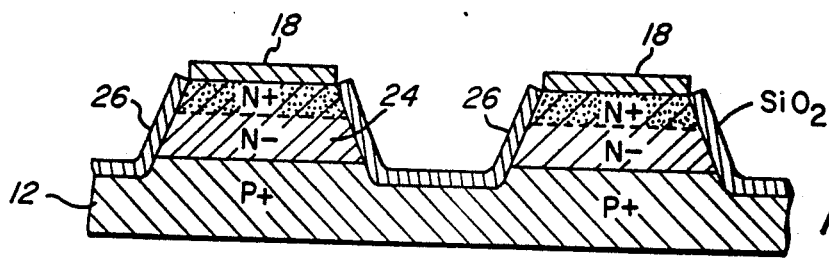
FIG. 6 is a cross-sectional view of the mesas shown in FIG. 5 after an oxide passivation layer has been grown on the mesa sidewalls.

Impurities are deposited at the top surface of the epitaxial layer 14 to form a high concentration N+ region 16 as shown in FIG. 2. Then, as shown in FIG. 3, a silicon nitride layer 18 is deposited on top of the high concentration region 16. Conventional techniques (e.g., masking and etching) are used to define a selective pattern in the silicon nitride layer 18. As shown in FIG. 4, the pattern in the silicon nitride layer 18 results from the removal of silicon nitride in the areas designated 20, so that the silicon nitride 18 remains only in the areas shown. The resulting pattern defines mesa islands which are subsequently anisotropically etched (using the silicon nitride layer 18 as a mask) to provide mesas 22 as shown in FIG. 5. In a preferred embodiment, the mesas are frustum shaped. By using an epitaxial wafer of <100> crystal orientation, the mesa wall angles are consistently reproducible by well-known anisotropic etching techniques.

The cross-sectional shape of the mesa is dictated by the mask pattern used. If the pattern of the silicon nitride mask 18 is a circle as shown in FIG. 5, then a frustum shaped mesa having a circular cross-section will result. If a square mask pattern is used, a mesa having a generally square cross-section with rounded corners will result. Other shapes will be apparent to those skilled in the art.

The resulting structure, shown in FIG. 5, comprises silicon nitride layer 18 on top of the mesa structure, followed by the high concentration N+ region 16, the high ohmic N− region 14, and the heavily doped P+ region 12 at the base of the mesa. At this point, a thick oxide layer (SiO$_2$) 26 is grown on the device. The oxide layer grows only where there is no silicon nitride, e.g., on the side wall 24 of each mesa 22. The silicon nitride thereby serves the dual purpose of providing a mask for use in etching the mesa and providing a mask for use in applying the oxide layer. The oxide layer passivates the device. The passivation layer ensures a stable high voltage junction, rendering the surface of the device stable electrically and also rendering the passivated portions impervious to harmful environmental effects.

Figure 7:
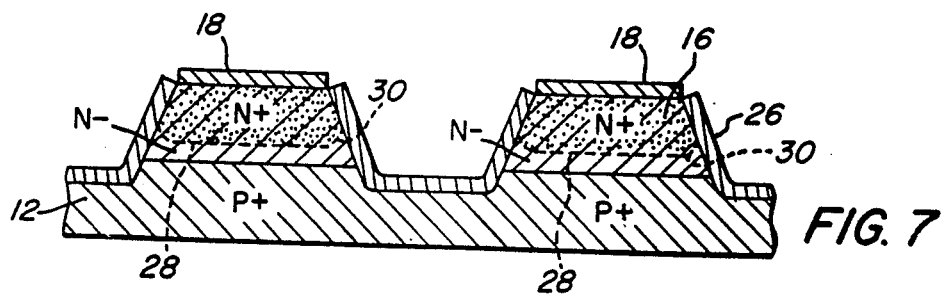
FIG. 7 is a cross-sectional view of a mesa after the N+ high concentration region has been diffused deeper into the mesa toward the P-N junction.

After the silicon dioxide passivation layer is grown, the high concentration region 16 is driven, via conventional diffusion techniques, deeper into the mesa toward the P-N junction. As illustrated in FIG. 7, the mesa geometry causes the diffusion to take on a generally concave shape as it penetrates into mesa 22. The concave shape is indicated by a dashed line having perimeter edges 30 and a central portion 28. The distance between the perimeter edges 30 of the high concentration region 16 and the wafer substrate 12 is greater than the distance between the central portion 28 and wafer substrate 12. Accordingly, the high ohmic N− region 14 is wider along the side wall surface 24 of mesa 22 than it is within the central portion of the mesa, resulting in a higher breakdown at the surface of the device.

After diffusing the high concentration region into the mesa as shown in FIG. 7, the breakdown voltage of the rectifier device can be measured by placing measurement probes across the junction and electrically breaking through the silicon nitride layer 18. If the breakdown voltage is found to be too high, then additional diffusion can be performed to drive the impurities forming the high concentration region even deeper into the mesa. The measuring and diffusing steps can be repeated as many times as necessary until a desired breakdown voltage is achieved. In this manner, it is possible to construct rectifiers having a very precise breakdown voltage, even if the epitaxial layer thickness and resistivity of the ohmic region vary from their intended specifications. This advantage is very helpful in the fabrication of zener diodes, because it is important to provide a precise zener breakdown voltage. In the past, it was often necessary to discard zener diodes during manufacture if they did not meet the rigid breakdown voltage requirements. The present invention obviates the need to waste such devices, since the devices can be optimized for precise voltages during the manufacturing process.

Figure 8:
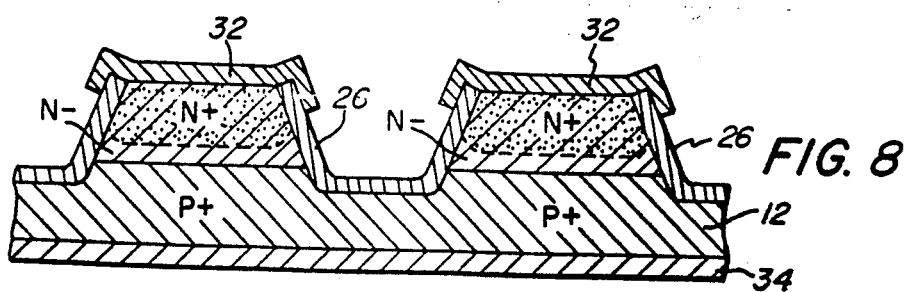
FIG. 8 is a cross-sectional view of the mesas of FIG. 7 after a metalization layer has been applied to the tops and a portion of the sidewalls thereof.

After the high concentration region has been driven to the required depth, the silicon nitride layer is removed and metalization layers 32, 34 are deposited on the top and bottom surface of the wafer. Photoresist techniques are used to define required metal patterns on the wafer's surface which will enable leads to be attached when the P-N junctions are packaged as individual rectifiers. The metalization layer 32 can overlay all or part of the mesa slope to act as a field shield as shown in FIG. 8. Alternatively, metalization layer 32 can overlay only the top of the mesa, in which case no field shield is provided.

After metalization, the individual diodes on each wafer are tested, marked, and the wafer is cut and broken into individual diodes. Each individual diode can then be packaged in a conventional manner.

It will be appreciated that the method described above can be modified in various respects without departing from the spirit and scope of the present invention. For example, the P-type and N-type materials shown in the drawings can be reversed. Thus, a semiconductor wafer having an N+ substrate with a P− epitaxial layer can be used. In such instance, the high concentration region would be fabricated using a P+ diffusion.

The process can also be modified to perform the deposition of the high concentration region after the mesa etch and oxidation. Additional diffusions can be performed to make more sophisticated devices on the top of the mesa. Further, additional diffusions can be performed at different points in the process to lower contact resistance.

Other fabrication techniques can be used to form the mesa structure. For example, the mesa can be mechanically cut into the wafer. Regardless of how the mesa is formed, an important aspect of the present invention is to drive the high concentration region toward the P-N junction after the mesa has been formed. In this manner, the diffusion will have the necessary concave shape and the resulting high ohmic region will be wider along its perimeter than in the central portion thereof.

While several embodiments have been described herein for purposes of illustration, it will be appreciated by those skilled in the art that other variations and modifications could be made thereto. It is intended to cover all such variations and modifications which fall within the scope of the present invention, as recited in the following claims.

What is claimed is:

1. A rectifier having a rectifying P-N junction with improved breakdown voltage characteristics, comprising:
   a mesa in at least the epitaxial layer of an epitaxially grown P-N wafer with the top of the mesa at the top surface of the epitaxial layer and the side wall of the mesa sloping outwardly from the top of the mesa toward the wafer substrate and extending into said substrate;
   a high concentration semiconductor region in the surface of the epitaxial layer, said high concentration region having the same polarity as the remainder of said epitaxial layer and the opposite polarity as said substrate, and covering an area sufficient to extend across the top of said mesa whereby a junction between said high concentration region and the remainder of said epitaxial layer intersects the side wall of said mesa; and
   an oxide layer on the side wall of said mesa to passivate said mesa, said oxide layer covering the P-N junction between said epitaxial layer and said substrate and said junction between said high concentration region and the remainder of said epitaxial layer;
   said high concentration region extending from the top of said mesa into said epitaxial layer, but not beyond the base of said mesa; and
   the high concentration region having a generally concave shape at the side wall of the mesa such that the distance between the high concentration region and the wafer substrate gradually increases in the direction of the sloping side wall of the mesa.

2. The rectifier of claim 1 wherein the depth of said high concentration region is set to establish a desired breakdown voltage for the rectifier.

3. The rectifier of claim 1 wherein said mesa is in the shape of a frustum.

4. A rectifier as set forth in claim 1 wherein said epitaxial layer and said substrate form a substantially flat P-N junction which intersects the sidewall of said mesa.

5. The rectifier of claim 1 further comprising a metal layer overlaying said high concentration region and said oxide layer on at least part of the mesa side wall to provide a field shield.

6. A rectifier as set forth in claim 1 wherein said oxide layer is a grown oxide layer.

7. A rectifier as set forth in claim 1 wherein said remainder of said epitaxial layer is shaped to be entirely depleted at breakdown.

8. An article of manufacture resulting from the steps of:
   providing a semiconductor junction having a semiconductor layer of a first polarity and an adjacent lightly doped semiconductor layer of a second polarity in a semiconductor wafer having <100> crystal orientation;
   forming a mesa in said lightly doped layer having walls defined by said <100> crystal orientation that slope outwardly from a top surface thereof toward said junction;
   forming a high concentration region extending entirely across the top surface of the mesa, said high concentration region being of the same semiconductor type as the lightly doped layer, whereby the junction between said high concentration region and the remainder of said lightly doped layer intersects the outwardly sloping walls of said mesa; and
   diffusing the high concentration region deeper into the mesa toward said junction but not below the base of the mesa, relying on the outward slope of the mesa geometry to cause the diffusion to take on a generally concave shape as it penetrates into the mesa, with the distance between the diffused high concentration region and the junction being greater adjacent the sloping walls of the mesa than in the central core of the mesa.

9. An article of manufacture resulting from the steps of:
   forming a mesa shape in at least the epitaxial layer of an epitaxially grown P-N wafer with the top of the mesa at the top surface of the epitaxial layer and the side wall of the mesa sloping outwardly from the top of the mesa toward the wafer substrate;
   forming a high concentration semiconductor region in the surface of the epitaxial layer, said region covering an area sufficient to extend across the top of said mesa, whereby a junction between said high concentration region and the remainder of said epitaxial layer intersects the side wall of said mesa; and
   driving said high concentration region from the top of said mesa deeper into said epitaxial layer, but not beyond the base of said mesa relying on the outward slope of the mesa geometry to cause the high concentration region to take on a generally concave shape as it penetrates into the epitaxial layer within the mesa, with the distance between the high concentration region and the wafer substrate being greater adjacent the sloping walls of the mesa than in the central portion of said mesa.

10. A rectifier having a rectifying P-N junction with improved breakdown voltage characteristics, comprising:
- a P-N junction formed from a P-type semiconductor layer and an adjacent N-type semiconductor layer, said layers defining a mesa with a top of the mesa in a top one of the layers, and a side wall of the mesa sloping outwardly from the top of the mesa toward the other layer and extending into said other layer;
- a high concentration region in the top layer of the mesa, said high concentration region having the same polarity as but a higher concentration than the remainder of the top layer and the opposite polarity as said other layer, and covering an area sufficient to extend across the top of said mesa, whereby a junction between said high concentration region and the remainder of said top layer intersects the side wall of said mesa; and
- a grown oxide layer on the side wall of said mesa to passivate said mesa, said oxide layer covering the P-N junction and said junction between said high concentration region and the remainder of said top layer,
- said high concentration region extending from the top of said mesa into said top layer with a generally concave shape at the side wall of the mesa such that the distance between the high concentration region and the P-N junction gradually increases in the direction of side wall of the mesa.

* * * * *